United States Patent
Toshima et al.

(10) Patent No.: US 10,844,332 B2
(45) Date of Patent: Nov. 24, 2020

(54) AQUEOUS CLEANING SOLUTION AND METHOD OF PROTECTING FEATURES ON A SUBSTRATE DURING ETCH RESIDUE REMOVAL

(71) Applicant: Tokyo Electron Limited, Minato (JP)

(72) Inventors: Takayuki Toshima, Hillsboro, OR (US); Hiroshi Marumoto, Hillsboro, OR (US); Yoshinori Nishiwaki, Tokyo (JP); Trace Hurd, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/220,216

(22) Filed: Dec. 14, 2018

(65) Prior Publication Data

US 2019/0185793 A1 Jun. 20, 2019

Related U.S. Application Data

(60) Provisional application No. 62/682,741, filed on Jun. 8, 2018, provisional application No. 62/599,511, filed on Dec. 15, 2017.

(51) Int. Cl.
*C11D 7/06* (2006.01)
*C11D 7/14* (2006.01)
(Continued)

(52) U.S. Cl.
CPC .............. *C11D 7/06* (2013.01); *C11D 3/0047* (2013.01); *C11D 3/0073* (2013.01); *C11D 3/044* (2013.01);
(Continued)

(58) Field of Classification Search
None
See application file for complete search history.

(56) References Cited

U.S. PATENT DOCUMENTS 6,020,292 A * 2/2000 Honda ............... C23G 1/22
134/2
6,276,996 B1 * 8/2001 Chopra ............... B24B 37/04
257/E21.304
(Continued)

FOREIGN PATENT DOCUMENTS

| EP | 1211564 A2 | 6/2002 |
|---|---|---|
| EP | 3051577 B1 | 10/2017 |
| JP | 2008129571 A | 6/2008 |

OTHER PUBLICATIONS

International Search Report and Written Opinion for related International application No. PCT/US2018/065632, dated Apr. 11, 2019, 13pp.

*Primary Examiner* — Jiong-Ping Lu

(57) ABSTRACT

An alkaline wet solution for protecting features on a patterned substrate and a substrate processing method using the alkaline wet solution are described. The method includes providing a patterned substrate containing a low-k material, a metal oxide feature, and an etch residue, performing a treatment process that exposes the patterned substrate to an alkaline wet solution that forms a protective coating on the metal oxide feature, the alkaline wet solution containing a mixture of 1) water, 2) ammonium hydroxide, a quaternary organic ammonium hydroxide, or a quaternary organic phosphonium hydroxide, and 3) dissolved silica, and performing a wet cleaning process that removes the etch residue but not the metal oxide feature that is protected by the protective coating. The patterned substrate can further include a metallization layer and the alkaline wet solution can further contain 4) an inhibitor that protects the metallization layer from etching by the alkaline wet solution.

18 Claims, 3 Drawing Sheets

(51) Int. Cl.

| | |
|---|---|
| *C11D 7/32* | (2006.01) |
| *C11D 3/00* | (2006.01) |
| *G03F 7/42* | (2006.01) |
| *H01L 21/768* | (2006.01) |
| *C11D 3/04* | (2006.01) |
| *C11D 3/08* | (2006.01) |
| *C11D 3/39* | (2006.01) |
| *C11D 7/36* | (2006.01) |
| *C11D 11/00* | (2006.01) |
| *H01L 21/311* | (2006.01) |

(52) U.S. Cl.
CPC .............. *C11D 3/08* (2013.01); *C11D 3/3947* (2013.01); *C11D 7/14* (2013.01); *C11D 7/32* (2013.01); *C11D 7/3209* (2013.01); *C11D 7/36* (2013.01); *C11D 11/0047* (2013.01); *G03F 7/42* (2013.01); *G03F 7/425* (2013.01); *H01L 21/31111* (2013.01); *H01L 21/31144* (2013.01); *H01L 21/76814* (2013.01)

(56) References Cited

U.S. PATENT DOCUMENTS

| | | |
|---|---|---|
| 7,674,755 B2 | 3/2010 | Egbe et al. |
| 9,862,914 B2 | 1/2018 | Kajikawa et al. |
| 2010/0116290 A1* | 5/2010 | Zhu .......................... C11D 3/43 134/7 |
| 2016/0111804 A1 | 4/2016 | Saito et al. |
| 2016/0201016 A1* | 7/2016 | Ivanov ................ C11D 11/0047 510/175 |
| 2016/0379870 A1* | 12/2016 | Clark ................ H01L 21/02178 438/694 |

\* cited by examiner

AQUEOUS CLEANING SOLUTION AND METHOD OF PROTECTING FEATURES ON A SUBSTRATE DURING ETCH RESIDUE REMOVAL

CROSS-REFERENCE TO RELATED APPLICATIONS

This application is related to and claims priority to U.S. Provisional Patent Application Ser. No. 62/599,511, filed on Dec. 15, 2017, the entire contents of which are herein incorporated by reference. This application is related to and claims priority to U.S. Provisional Patent Application Ser. No. 62/682,741, filed on Jun. 8, 2018, the entire contents of which are herein incorporated by reference.

FIELD OF THE INVENTION

The present invention relates to alkaline wet solutions for protecting features on a patterned substrate during etch residue removal and methods of using the same.

BACKGROUND OF THE INVENTION

Dry etching in conjunction with photolithographic techniques is widely used in semiconductor fabrication processes. Any etch residue left after the dry etching process can be nonvolatile and thermally stable, and if not removed, it can result in degradation or failure of a semiconductor device. However, various patterned features on a substrate that containing different materials may need to be protected from etching during the etch residue removal.

SUMMARY OF THE INVENTION

Embodiments of the invention provide an alkaline wet solution and a substrate processing method for protecting features on a patterned substrate during etch residue removal.

According to one embodiment, the method includes providing a patterned substrate containing a low-k material, a metal oxide feature, and an etch residue, and performing a treatment process that exposes the patterned substrate to an alkaline wet solution that forms a protective coating on the metal oxide feature, the alkaline wet solution containing a mixture of 1) water, 2) ammonium hydroxide, a quaternary organic ammonium hydroxide, or a quaternary organic phosphonium hydroxide, and 3) dissolved silica. The method further includes performing a wet cleaning process that removes the etch residue but not the metal oxide feature that is protected by the protective coating. The patterned substrate can further include a metallization layer and the alkaline wet solution can further contain 4) an inhibitor that protects the metallization layer from etching by the alkaline wet solution.

According to another embodiment, the method includes providing a patterned substrate containing a low-k material, an aluminum oxide feature, and a polymer etch residue, and performing a treatment process that exposes the patterned substrate to an alkaline wet solution to form a protective coating on the aluminum oxide feature, the alkaline wet solution containing a mixture of 1) water, 2) ammonium hydroxide, and 3) dissolved silica. The method further includes performing a wet cleaning process that removes the polymer etch residue but not the aluminum oxide feature that is protected by the protective coating. The patterned substrate can further include a metallization layer and the alkaline wet solution can further contain 4) an inhibitor that protects the metallization layer from etching by the alkaline wet solution, where the metallization layer includes cobalt metal, copper metal, or tungsten metal, and the inhibitor contains an azole compound that includes a triazole, a triazole derivative, a tetrazole, or a tetrazole derivative.

According to one embodiment, an alkaline wet solution is provided for protecting features on a patterned substrate, where the alkaline wet solution contains 1) water, 2) ammonium hydroxide, a quaternary organic ammonium hydroxide, or a quaternary organic phosphonium hydroxide, and 3) dissolved silica. The alkaline wet solution can further include 4) an inhibitor that contains an azole compound.

BRIEF DESCRIPTION OF THE DRAWINGS

A more complete appreciation of embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Embodiments of the invention describe an alkaline wet solution and a substrate processing method that protects features on a patterned substrate during etch residue removal. The substrate can, for example, be a circular wafer with a diameter of 100 mm, 200 mm, 300 mm, or 450 mm. The wafer can be a thin slice of semiconductor material, such as crystalline silicon, that is used in electronics for the fabrication of integrated circuits and in photovoltaics for conventional, wafer-based solar cells. The wafer can serve as the substrate for microelectronic devices built in and over the wafer and the wafer undergoes many microfabrication process steps such as doping or ion implantation, etching, deposition of various materials, and photolithographic patterning.

Figure 1A:
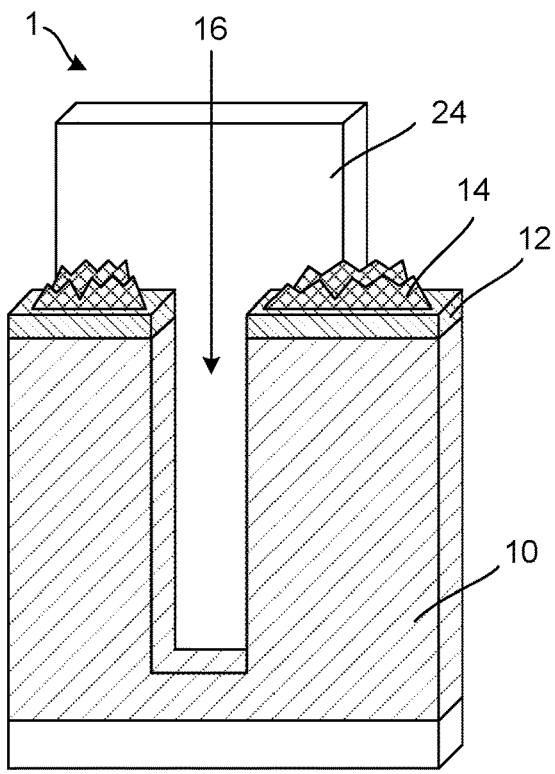
FIGS. 1A and 1B show through schematic cross-sectional views the damage done to an aluminum oxide feature on a patterned substrate during removal of an etch residue.
Figure 1B:
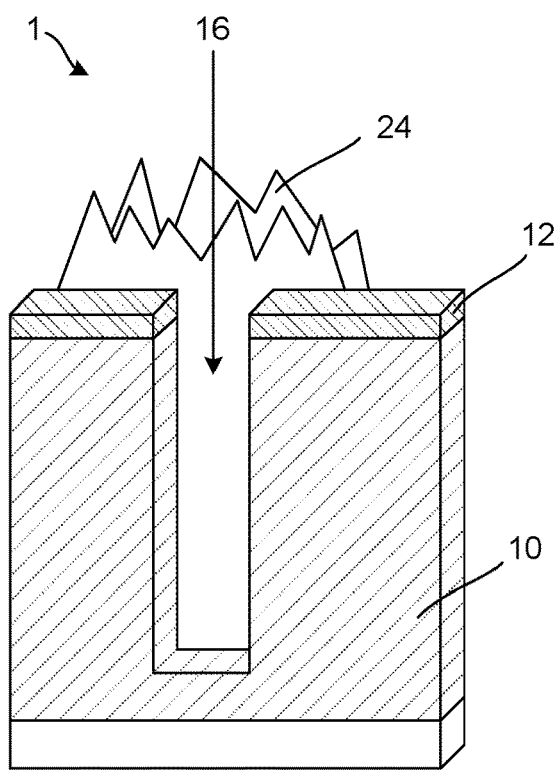

FIGS. 1A and 1B show through schematic cross-sectional views the damage done to an aluminum oxide feature on a patterned substrate during removal of an etch residue. The exemplary patterned substrate 1 contains a low-k material 10 having a recessed feature 16 etched therein, a metal-containing etch hardmask layer 12 (e.g., $Al_2O_3$) on the low-k material 10, and an etch residue 14 on the metal-containing etch hardmask layer 12. The patterned substrate 1 further contains an aluminum oxide ($Al_2O_3$) feature 24. The etch residue 14 may be formed during processing of the patterned substrate 1, including during dry etching of the recessed feature 16 in the low-k material 10. The etch residue 14 can contain a variety of etch byproducts from etching the various films and layers on the patterned substrate 1. The etch residue 14 can, for example, contain a polymer. The polymer can include a halogen-containing polymer or a halogen-containing organic polymer from the use of halogen-containing etch gases to form the recessed feature 16. The polymer can also contain metal-containing species that are etched from metal-containing layers of the patterned substrate 1.

The etch residue 14 can be nonvolatile and thermally stable, and if not removed, it can result in degradation or failure of a semiconductor device containing the patterned substrate 1. The etch residue 14 may be effectively removed using a variety of commercially available wet solutions, including wet solutions containing ammonium hydroxide. However, the inventors have realized that wet solutions that are acidic or basic easily etch the aluminum oxide feature 24 and a portion of the aluminum oxide feature 24 is therefore easily dissolved. FIG. 1B shows the patterned substrate 1 following a cleaning process that removes the etch residue 14 but also severely etches and damages the aluminum oxide feature 24. This etching of the aluminum oxide feature 24 is unacceptable in semiconductor manufacturing.

Figure 2A:
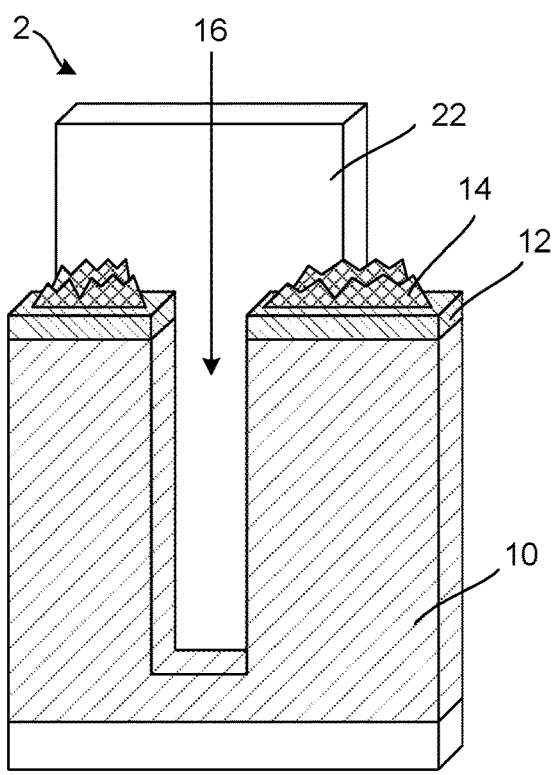
FIGS. 2A-2C show through schematic cross-sectional views a method for protecting a metal oxide feature on a patterned substrate during removal of an etch residue according to an embodiment of the invention.
Figure 2B:
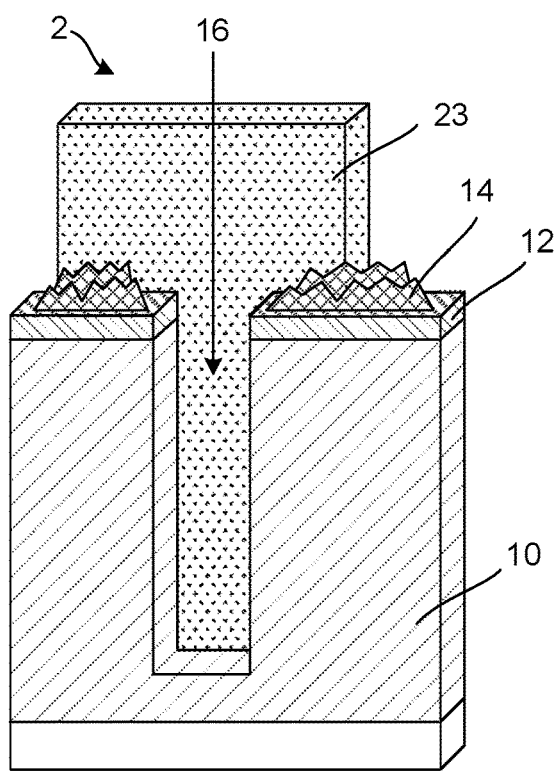
Figure 2C:
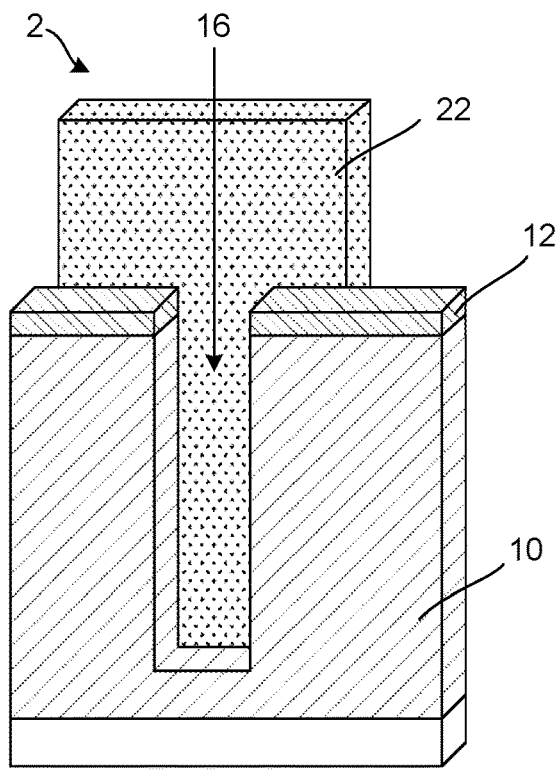

FIGS. 2A-2C show through schematic cross-sectional views a method for protecting a metal oxide feature on a patterned substrate during removal of an etch residue according to an embodiment of the invention. The substrate processing method may, for example, be performed in a CELLESTA™ single wafer cleaning system from Tokyo Electron Limited, Akasaka, Japan.

The patterned substrate 1 in FIG. 1A has been reproduced as patterned substrate 2 in FIG. 2A. The patterned substrate 2 includes a low-k material 10, a metal oxide feature 22, a metal-containing etch hardmask layer 12, and an etch residue 14. The low-k material 10 can, as the name indicates, have a dielectric constant less than that of $SiO_2$ (~4), and preferably less than 3, such as a carbon-containing dielectric. In some examples, the low-k material 10 can include BLACK DIAMOND™, from Applied Materials, Santa Clara, Calif.; SILK™, from Dow Chemical, Midland, Mich.; CORAL™, from Lam Research Corp., Fremont, Calif., or a combination thereof, or other carbon containing dielectrics. In other examples, the low-k material 10 can include a spin-on low-k material. Some examples of the low-k material 10 contain Si, O, C, and H, and can contain varying degrees of porosity to achieve k values below that of $SiO_2$. According to embodiments of the invention, the metal oxide feature 22 may include a metal oxide material that is suitable for manufacturing semiconductor devices. In some examples, the metal oxide feature 22 can include aluminum oxide ($Al_2O_3$), hafnium oxide ($HfO_2$), zirconium oxide ($ZrO_2$), or titanium oxide ($TiO_2$). According to another embodiment, the metal-containing etch hardmask layer 12 may be omitted and the etch residue 14 can form on the low-k material 10.

The substrate processing method includes performing a treatment process that exposes the patterned substrate 2 to a water-based alkaline wet solution containing a mixture of 1) water, 2) ammonium hydroxide ($NH_4OH$), a quaternary organic ammonium hydroxide, or a quaternary organic phosphonium hydroxide, and 3) dissolved silica, where the alkaline wet solution forms a protective coating 23 on the metal oxide feature 22. This is depicted in FIG. 2B. It is believed that the protective coating 23 contains a coating of byproducts containing silica from the alkaline wet solution. In addition to the etch residue 14, the metal-containing etch hardmask layer 12, the metal oxide feature 22, and a surface of the low-k material 10 in the recessed feature 16 are also exposed to the alkaline wet solution. Following the treatment process, the patterned substrate 2 may be rinsed with de-ionized water (DIW) and isopropyl alcohol (IPA).

The dissolved silica may be formed by a variety of methods, including adding fine silica particles to an alkaline wet solution, or bubbling a silicon-containing gas through the alkaline wet solution. The silicon-containing gas can, for example, include hexamethyldisilane (HMDS) or a tetraalkoxy silane (e.g., tetraethoxy silane or tetramethoxy silane). In one example, the dissolved silica may include ultra high purity colloidal silica that is commercially available from Fuso Chemical Co., Ltd, Tokyo, Japan. Colloidal silica includes silica particles that are suspended in a liquid. In one example, the size of the silica particles can range from about 15 nm to about 370 nm.

According to one embodiment, the amount of the ammonium hydroxide is in a range from about 0.01 wt % to about 25 wt %, based on the total weight of the alkaline wet solution, and the amount of the dissolved silica is in a range from about 0.005 wt % to about 10 wt %, based on the total weight of the alkaline wet solution. According to another embodiment, the amount of the ammonium hydroxide is in a range from about 0.1 wt % to about 3 wt %, based on the total weight of the alkaline wet solution, and the amount of the dissolved silica is in a range from about 0.1 wt % to about 2 wt %, based on the total weight of the alkaline wet solution.

According to one embodiment, the amount of the quaternary organic ammonium hydroxide is in a range from about 0.01 wt % to about 25 wt %, based on the total weight of the alkaline wet solution, and the amount of the dissolved silica is in a range from about 0.005 wt % to about 15 wt %, based on the total weight of the alkaline wet solution. According to another embodiment, the amount of the quaternary organic ammonium hydroxide is in a range from about 0.1 wt % to about 10 wt %, based on the total weight of the alkaline wet solution, and the amount of the dissolved silica is in a range from about 0.01 wt % to about 10 wt %, based on the total weight of the alkaline wet solution.

According to one embodiment, the amount of the quaternary organic phosphonium hydroxide is in a range from about 0.01 wt % to about 25 wt %, based on the total weight of the alkaline wet solution, and the amount of the dissolved silica is in a range from about 0.005 wt % to about 15 wt %, based on the total weight of the alkaline wet solution. According to another embodiment, the amount of the quaternary organic phosphonium hydroxide is in a range from about 0.1 wt % to about 10 wt %, based on the total weight of the alkaline wet solution, and the amount of the dissolved silica is in a range from about 0.01 wt % to about 10 wt %, based on the total weight of the alkaline wet solution.

According to one embodiment, the quaternary organic ammonium hydroxide can contain tetramethylammonium hydroxide, tetraethylammonium hydroxide, tetrabutylammonium hydroxide, or hydroxyethyltrimethylammonium hydroxide. However, other quaternary organic ammonium hydroxides may be used.

According to one embodiment, the quaternary organic phosphonium hydroxide can contain tetrabutyl phosphonium hydroxide, methyl triphenyl phosphonium hydroxide, ethyl triphenyl phosphonium hydroxide, or tetra-n-butyl phosphonium hydroxide. However, other quaternary organic phosphonium hydroxides may be used.

According to some embodiments, the pH of the alkaline wet solution may be in a range from about 8 to about 13, or from about 9 to about 12. The temperature of the alkaline wet solution can be around room temperature, or above room temperature for faster processing. In some examples, the temperature of the alkaline wet solution can be between room temperature and about 90° C., between room temperature and about 80° C., or between about 60° C. and about 80° C. In one example, the temperature of the alkaline wet solution can be about 75° C.

The substrate processing method further includes performing a wet cleaning process that removes the etch residue 14 but not the metal oxide feature 22 that is protected by the protective coating 23. This is schematically shown in FIG. 2C. The wet cleaning process may be selected from commonly used acidic or basic chemical processes used for etch residue removal in semiconductor manufacturing. For example, SC-1 ($NH_4OH/H_2O_2/H_2O$) or other $NH_4OH$-based chemical solutions, or SC-2 ($HCl/H_2O_2/H_2O$) chemical solution, may be used for the etch residue removal. Following the wet cleaning process, the patterned substrate 2 may be rinsed with DIW and IPA.

Figure 3A:
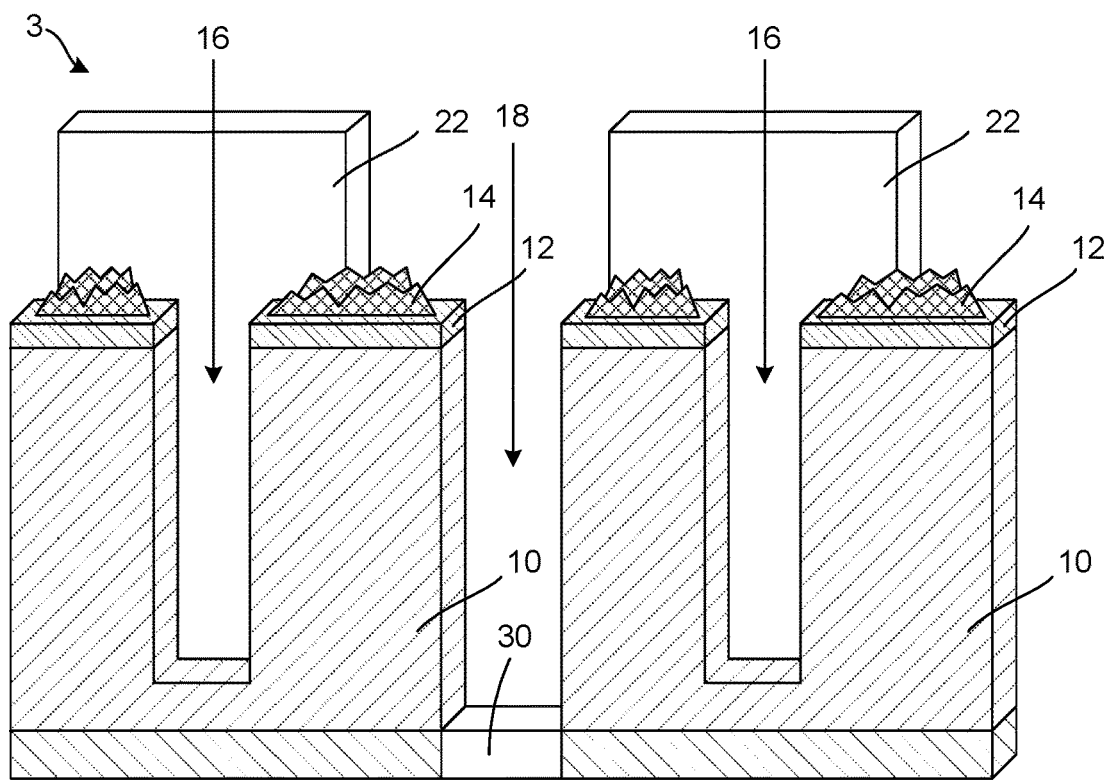
FIGS. 3A-3C show through schematic cross-sectional views a method for protecting a metal oxide feature and a metallization layer of a patterned substrate during removal on an etch residue according to an embodiment of the invention.
Figure 3B:
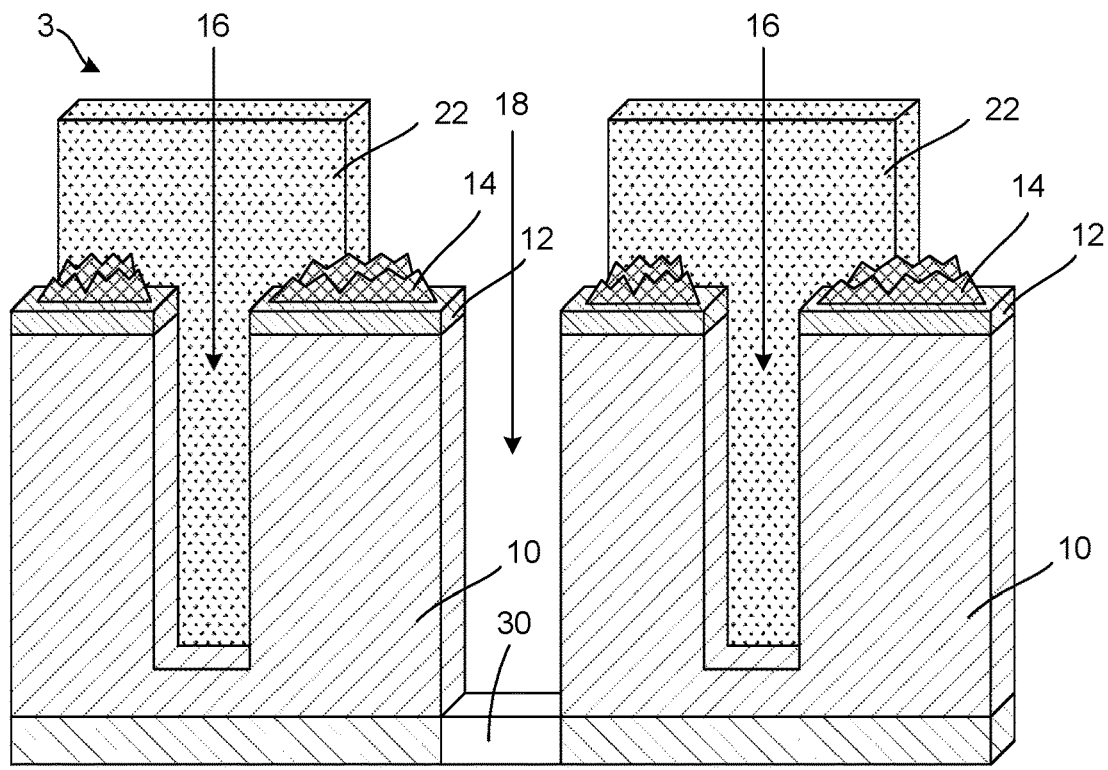
Figure 3C:
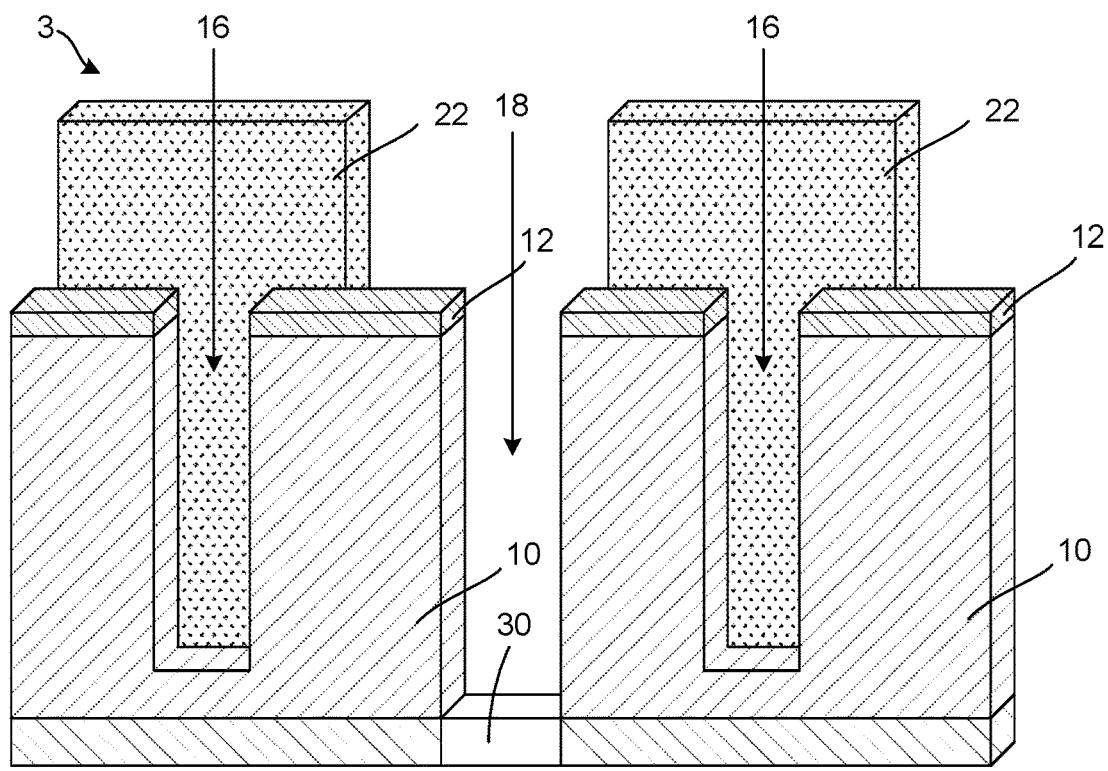

FIGS. 3A-3C show through schematic cross-sectional views a method for protecting a metal oxide feature and a metallization layer on a patterned substrate during removal of an etch residue according to an embodiment of the invention. The patterned substrate 3 in FIG. 3A is similar to the patterned substrate 1 in FIG. 1A. The patterned substrate 3 includes a low-k material 10, a metal oxide feature 22, a metal-containing etch hardmask layer 12, a metallization layer 30, a recessed feature 18 in the low-k material 10 down to the metallization layer 30, and an etch residue 14. The metallization layer 30 can, for example, include cobalt metal (Co), copper metal (Cu), or tungsten metal (W). The patterned substrate 3 further contains a metal oxide feature 22.

The metallization layer 30 may be etched by the alkaline wet solution used in the treatment process described above that forms the protective coating 23 on the metal oxide feature 22. Therefore, the inventors have realized that an inhibitor may be added to the alkaline wet solution to protect the metallization layer 30 from etching during the treatment process.

Accordingly, the substrate processing method includes performing a treatment process that exposes the patterned substrate 3 to a water-based alkaline wet solution containing a mixture of 1) water, 2) ammonium hydroxide, a quaternary organic ammonium hydroxide, or a quaternary organic phosphonium hydroxide, and 3) dissolved silica to form a protective coating 23 on the metal oxide feature 22. This is schematically shown in FIG. 3B. The alkaline wet solution further contains 4) an inhibitor for protecting the metallization layer 30 during the treatment process. The inhibitor can prevent undesirable surface reactions by forming a passive layer (not shown) containing a complex between the metallization layer 30 and the inhibitor. The inhibitor can, for example, contain an azole compound. Azole compounds are characterized by a 5-membered ring that contains at least one nitrogen atom. Examples of azole compounds include triazoles (i.e., the heterocyclic class of compounds with molecular formula $C_2H_3N_3$), triazole derivatives (e.g., benzotriazole ($C_6H_5N_3$), tetrazole ($CH_2N_4$), and tetrazole derivatives. Following the treatment process, the patterned substrate 3 may be rinsed with DIW and IPA.

In one example, the amount of ammonium hydroxide may be in a range from about 0.01 wt % to about 25 wt %, based on the total weight of the alkaline wet solution, and the amount of dissolved silica is in a range from about 0.005 wt % to about 10 wt %, based on the total weight of the alkaline wet solution. In another example, the amount of the ammonium hydroxide is in a range from about 0.1 wt % to about 3 wt %, based on the total weight of the alkaline wet solution, and the amount of the dissolved silica is in a range from about 0.1 wt % to about 2 wt %, based on the total weight of the alkaline wet solution.

In one example, the amount of the quaternary organic ammonium hydroxide may be in a range from about 0.01 wt % to about 25 wt %, based on the total weight of the alkaline wet solution, and the amount of the dissolved silica is in a range from about 0.005 wt % to about 15 wt %, based on the total weight of the alkaline wet solution. In another example, the amount of the quaternary organic ammonium hydroxide may be in a range from about 0.1 wt % to about 10 wt %, based on the total weight of the alkaline wet solution, and the amount of the dissolved silica is in a range from about 0.01 wt % to about 10 wt %, based on the total weight of the alkaline wet solution.

In one example, the amount of the quaternary organic phosphonium hydroxide may be in a range from about 0.01 wt % to about 25 wt %, based on the total weight of the alkaline wet solution, and the amount of the dissolved silica is in a range from about 0.005 wt % to about 15 wt %, based on the total weight of the alkaline wet solution. In another example, the amount of the quaternary organic phosphonium hydroxide may be in a range from about 0.1 wt % to about 10 wt %, based on the total weight of the alkaline wet solution, and the amount of the dissolved silica is in a range from about 0.01 wt % to about 10 wt %, based on the total weight of the alkaline wet solution.

According to one embodiment, the quaternary organic ammonium hydroxide can contain tetramethylammonium hydroxide, tetraethylammonium hydroxide, tetrabutylammonium hydroxide, or hydroxyethyltrimethylammonium hydroxide. However, other quaternary organic ammonium hydroxides may be used.

According to one embodiment, the quaternary organic phosphonium hydroxide can contain tetrabutyl phosphonium hydroxide, methyl triphenyl phosphonium hydroxide, ethyl triphenyl phosphonium hydroxide, or tetra-n-butyl phosphonium hydroxide. However, other quaternary organic ammonium hydroxides may be used.

In one example, the amount of the triazole, the triazole derivative, the tetrazole, or the tetrazole derivative may be in a range from about 0.01 wt % to about 10 wt %, based on the total weight of the alkaline wet solution.

According to some embodiments, the pH of the alkaline wet solution containing the inhibitor may be in a range from about 8 to about 13, or from about 9 to about 12. The temperature of the alkaline wet solution can be around room temperature, or above room temperature for faster processing. In some examples, the temperature of the alkaline wet solution can be between room temperature and about 90° C., between room temperature and about 80° C., or between about 60° C. and about 80° C. In one example, the temperature of the alkaline wet solution can be about 75° C.

The substrate processing method further includes performing a wet cleaning process that removes the etch residue 14 but not the metal oxide feature 22 protected by the protective coating 23. This is schematically shown in FIG. 3C. The wet cleaning process may be selected from commonly used acidic or basic chemical processes for etch residue removal in semiconductor manufacturing. In some examples, SC-1 or SC-2 chemical solutions may be used for the etch residue removal. Following the wet cleaning process, the patterned substrate 3 may be rinsed with DIW and IPA.

An alkaline wet solution and a substrate processing method for protecting features on a patterned substrate during etch residue removal have been disclosed in various embodiments. Those skilled in the art will readily realize that the substrate processing methods described herein may be applied to other patterned substrates than shown in the

What is claimed is:

1. A substrate processing method, comprising:
providing a patterned substrate containing a low-k material, a metal oxide feature, and an etch residue;
performing a treatment process that exposes the patterned substrate to an alkaline wet solution that forms a protective coating on the metal oxide feature, the alkaline wet solution containing a mixture of 1) water, 2) ammonium hydroxide, a quaternary organic ammonium hydroxide, or a quaternary organic phosphonium hydroxide, and 3) dissolved silica;
rinsing the alkaline wet solution from the patterned substrate; and
following the rinsing, performing a wet cleaning process that removes the etch residue but not the metal oxide feature that is protected by the protective coating, wherein the wet cleaning process includes a mixture containing $NH_4OH$, $H_2O_2$, and water, or HCl, $H_2O_2$ and water.

2. The method of claim 1, wherein the metal oxide feature includes aluminum oxide ($Al_2O_3$), hafnium oxide ($HfO_2$), zirconium oxide ($ZrO_2$), or titanium oxide ($TiO_2$).

3. The method of claim 1, wherein the patterned substrate further contains a metal-containing etch hardmask layer on the low-k material, wherein at least a portion of the etch residue is located on the metal-containing etch hardmask layer.

4. The method of claim 1, wherein the etch residue contains a polymer.

5. The method of claim 1, wherein the quaternary organic ammonium hydroxide includes tetramethylammonium hydroxide, tetraethylammonium hydroxide, or tetrabutylammonium hydroxide, and the quaternary organic phosphonium hydroxide includes tetrabutyl phosphonium hydroxide, methyl triphenyl phosphonium hydroxide, ethyl triphenyl phosphonium hydroxide, or tetra-n-butyl phosphonium hydroxide.

6. The method of claim 1, wherein the pH of the alkaline wet solution is in a range from about 8 to about 13 during the treatment process.

7. The method of claim 1, wherein the alkaline wet solution is maintained at a temperature between room temperature and about 90° C. during the treatment process.

8. The method of claim 1, wherein the patterned substrate further includes a metallization layer and the alkaline wet solution further contains 4) an inhibitor that protects the metallization layer from etching by the alkaline wet solution.

9. The method of claim 8, wherein the metallization layer includes cobalt metal, copper metal, or tungsten metal.

10. The method of claim 8, wherein the inhibitor contains an azole compound that includes a triazole, a triazole derivative, a tetrazole, or a tetrazole derivative.

11. The method of claim 1, wherein the rinsing includes rinsing the patterned substrate with de-ionized water (DIW) and isopropyl alcohol (IPA).

12. The method of claim 1, wherein the amount of ammonium hydroxide is in a range from about 0.01 wt % to about 25 wt %, based on the total weight of the alkaline wet solution, and the amount of dissolved silica is in a range from about 0.005 wt % to about 10 wt %, based on the total weight of the alkaline wet solution.

13. The method of claim 1, wherein the amount of the quaternary organic ammonium hydroxide is in a range from about 0.01 wt % to about 25 wt %, based on the total weight of the alkaline wet solution, and the amount of the dissolved silica is in a range from about 0.005 wt % to about 15 wt %, based on the total weight of the alkaline wet solution.

14. The method of claim 1, wherein the amount of the quaternary organic phosphonium hydroxide is in a range from about 0.01 wt % to about 25 wt %, based on the total weight of the alkaline wet solution, and the amount of the dissolved silica is in a range from about 0.005 wt % to about 15 wt %, based on the total weight of the alkaline wet solution.

15. A substrate processing method, comprising:
providing a patterned substrate containing a low-k material, an aluminum oxide feature, and a polymer etch residue;
performing a treatment process that exposes the patterned substrate to an alkaline wet solution to form a protective coating on the aluminum oxide feature, the alkaline wet solution containing a mixture of 1) water, 2) ammonium hydroxide, and 3) dissolved silica;
rinsing the alkaline wet solution from the patterned substrate; and
following the rinsing, performing a wet cleaning process that removes the polymer etch residue but not the aluminum oxide feature that is protected by the protective coating, wherein the wet cleaning process includes a mixture containing $NH_4OH$, $H_2O_2$, and water, or HCl, $H_2O_2$ and water.

16. The method of claim 15, wherein the patterned substrate further includes a metallization layer and the alkaline wet solution further contains 4) an inhibitor that protects the metallization layer from etching by the alkaline wet solution, wherein the metallization layer includes cobalt metal, copper metal, or tungsten metal, and the inhibitor contains an azole compound that includes a triazole, a triazole derivative, a tetrazole, or a tetrazole derivative.

17. The method of claim 15, wherein the rinsing includes rinsing the patterned substrate with de-ionized water (DIW) and isopropyl alcohol (IPA).

18. The method of claim 15, wherein the amount of ammonium hydroxide is in a range from about 0.01 wt % to about 25 wt %, based on the total weight of the alkaline wet solution, and the amount of dissolved silica is in a range from about 0.005 wt % to about 10 wt %, based on the total weight of the alkaline wet solution.

* * * * *